United States Patent [19]

Norton

[11] Patent Number: 5,293,036
[45] Date of Patent: Mar. 8, 1994

[54] RADIATION DETECTOR ARRAY HAVING CENTER SURROUND PIXEL OUTPUT

[75] Inventor: Paul R. Norton, Santa Barbara, Calif.
[73] Assignee: Santa Barbara Research Center, Goleta, Calif.
[21] Appl. No.: 393,343
[22] Filed: Aug. 11, 1989
[51] Int. Cl.⁵ .............................................. H01J 40/14
[52] U.S. Cl. .................................. 250/208.1; 250/332
[58] Field of Search ............................. 250/208.1, 332

[56] References Cited
U.S. PATENT DOCUMENTS

| | | | |
|---|---|---|---|
| 4,499,384 | 2/1985 | Segawa et al. | 250/208.1 X |
| 4,694,185 | 9/1987 | Weiss | 250/208.1 |
| 4,910,412 | 3/1990 | Ondris | 250/208.1 |

Primary Examiner—Mark Hellner
Attorney, Agent, or Firm—W. C. Schubert; W. K. Denson-Low

[57] ABSTRACT

A backside illuminated array (10) of radiation detectors (12) each of which has an output terminal for expressing a center-surround output signal. The array includes a plurality of the radiation detectors (12) disposed substantially adjacent to a first surface of the array, each of the radiation detectors comprising a central radiation detector (20) having a radiation absorbing area that is substantially surrounded by a radiation absorbing area of an associated peripheral radiation detector (22). The array further includes a transmission grating structure (16) disposed over a second surface (14a) of the array opposite the first surface for diffracting incident radiation for uniformly illuminating associated central and peripheral radiation detectors. The array further includes a plurality of flux concentrating structures (18) interposed between the transmission grating structure and the plurality of radiation detectors. Individual ones of the flux concentrating structures are disposed in registration with an individual one of the radiation detectors for concentrating incident optical radiation upon the central radiation detector thereof.

21 Claims, 2 Drawing Sheets

RADIATION DETECTOR ARRAY HAVING CENTER SURROUND PIXEL OUTPUT

FIELD OF THE INVENTION

This invention relates generally to arrays of radiation detectors and, in particular, relates to radiation detector array wherein each detector is comprised of a plurality of detectors coupled together to directly provide a center-surround output signal.

BACKGROUND OF THE INVENTION

To achieve a center-surround type output from individual detectors or pixels of a conventional radiation detecting array it is necessary to post-process the detector signals external to the array. Such signal processing is computationally intensive and, for an array of typical dimensions, requires a significant amount of time. As such, the use of center-surround signal processing techniques is generally precluded for real-time applications unless special purpose, high speed signal processing circuitry is provided. The provision of high speed circuitry is however disadvantageous at least for cost, weight and power consumption reasons.

A further disadvantage associated with conventional center-surround radiation detector techniques is that the array of detectors is generally not readily coupled to an artificial neural network signal processor.

A two-dimensional imaging array with center-surround type outputs would resemble in operation the photoreceptive cells of the retina. Therefore it is believed that subsequent signal processing with neural network circuitry would yield significant speed improvements and other advantages allowing for real-time image recognition and analysis. However, due to the required time consuming post-processing of the detector outputs to produce a center-surround pixel output signal the use of neural network processors for other than trivial real-time imaging applications is generally foreclosed.

It is therefore one object of the invention to provide an array of radiation detectors having an inherent center-surround pixel output signal.

It is another object of the invention to provide an array of radiation detectors having a center-surround pixel output signal that is suitable for use in real-time imaging applications.

It is one further object of the invention to provide an array of radiation detectors having a center-surround pixel output signal that is amenable to being coupled to a neural network signal processor for use in real-time imaging applications.

SUMMARY OF THE INVENTION

The foregoing problems are overcome and other advantages are realized by a radiation detector having an output terminal for expressing a center-surround output signal. In accordance with the invention the radiation detector comprises a first radiation detector having a radiation absorbing area substantially surrounded by a radiation absorbing area of a second radiation detector. An anode of the first radiation detector is electrically coupled to a cathode of the second radiation detector and an anode of the second radiation detector is electrically coupled to a cathode of the first radiation detector and electrically coupled also to the output terminal.

Further in accordance with the invention there is disclosed a backside illuminated array of radiation detectors each of which has an output terminal for expressing a center-surround output signal. The array includes a plurality of radiation detectors disposed substantially adjacent to a first surface of the array, each of the radiation detectors comprising a central radiation detector having a radiation absorbing area that is substantially surrounded by a radiation absorbing area of an associated peripheral radiation detector. The array further includes a transmission grating structure disposed over a second surface of the array opposite the first surface for diffracting incident radiation for uniformly illuminating associated central and peripheral radiation detectors. The array further includes a plurality of flux concentrating structures interposed between the transmission grating structure and the plurality of radiation detectors. Individual ones of the flux concentrating structures are disposed in registration with an individual one of the radiation detectors for concentrating incident optical radiation upon the central radiation detector thereof.

BRIEF DESCRIPTION OF THE DRAWING

The above set forth and other features of the invention will be made more apparent in the ensuing Detailed Description of the Invention when read in conjunction with the attached Drawing, wherein.

DETAILED DESCRIPTION OF THE INVENTION

Figure 1:
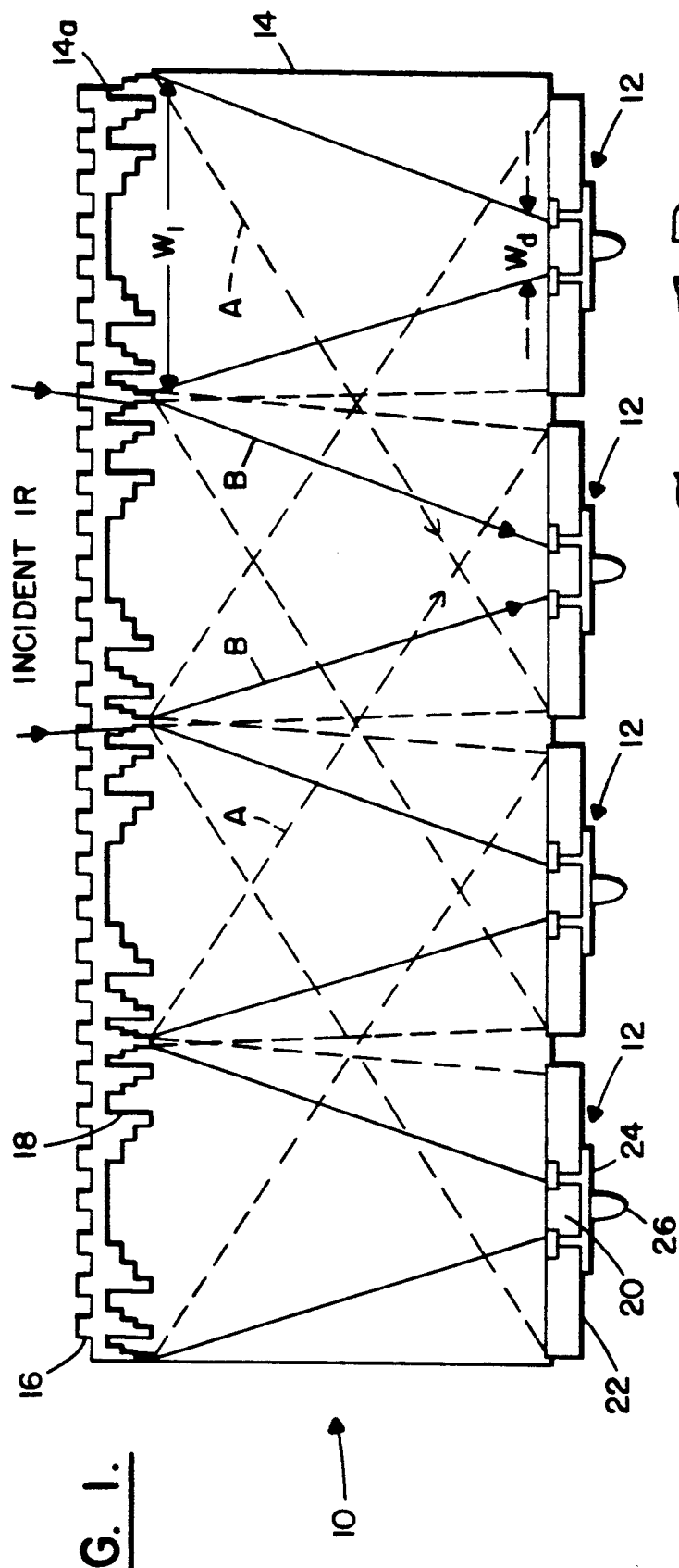
FIG. 1 is cross-sectional view, not to scale, of a center-surround focal plane output having a binary optic detector design.

Referring first to FIG. 1 there is shown in cross-section a portion of a backside-illuminated array 10 of radiation detectors 12. Array 10 is comprised of a substrate 14 that is substantially transparent to incident radiation. By example, the substrate 14 may be comprised of Group II–VI material such as CdTe or CdZnTe which is substantially transparent to infrared (IR) radiation. As such, the detectors 12 may be formed in a radiation absorbing layer of HgCdTe which is formed on a lower surface of the substrate 14. It should be realized however that the teaching of the invention is applicable to arrays of radiation detectors comprised of Group III–V material, Group II–VI material, silicon, germanium and other suitable materials.

In accordance with one embodiment of the invention there is provided on a radiation receiving surface 14a of the array 10 a transmission grating surface such as a diffraction grating 16 that is formed over an integral flux concentrating structure. In this embodiment of the invention the flux concentrating structure is a binary optics lens element 18 that is etched directly into the surface 14a of the substrate 14, such as is taught in U.S.

patent application Ser. No. 392,757, filed Aug. 1, 1989, "Binary Optics Microlens Array Integral To Detector Array Substrate", and also in U.S. patent application Ser. No. 392,751, filed Aug. 11, 1989, "Method OF Fabricating A Binary Optics Microlens Upon A Detector Array". A plurality of binary lens elements 18 are provided, individual ones of which are in registration with individual ones of the detectors 12. In other unillustrated embodiments of the invention the flux concentrating structure may comprise a discrete lenslet comprised of a high index material such as Ge formed within the surface 14a in a manner disclosed in patent application Ser. No. 398,338, filed Aug. 11, 1989, "Method and Apparatus for Concentrating Optical Flux In A Focal Plane Array". In still other unillustrated embodiments of the invention the flux concentrating structure may be provided external to the array as, for example, as a faceplate having lens elements formed therein, the faceplate being bonded or otherwise coupled to the surface 14a. In this latter embodiment the diffraction grating 16 would typically also then be separately provided with the faceplate.

Figure 2:
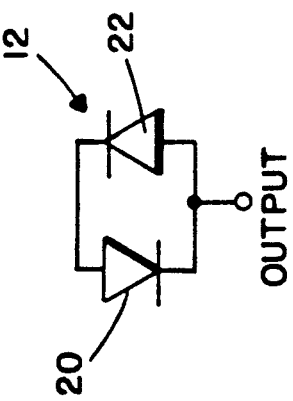
FIG. 2 is a schematic diagram showing the coupling together of two detectors to form the center-surround detector of FIG. 1.

Each of the center-surround detectors 12 is comprised of a detector pair including a central detector 20 that is surrounded by a peripheral detector 22. A conductor 24 is provided for coupling together the two detectors 20 and 22 in a manner shown in, by example, the schematic of FIG. 2. In addition, a coupler such as an indium bump 26 is provided for coupling each center-surround detector 12 output signal to read-out electronics (not shown).

By example, the width ($W_1$) of the lens element 18 may be 50 microns while the width ($W_d$) of the central detector 20 of the center-surround detector 12 is approximately 12 microns. The overall detector 12 width is typically slightly less than the width of the element 18, the width $W_1$ defining the cell size for the array pixel. The thickness of the substrate 14, for a f/1 system, is also approximately 50 microns. The incident IR radiation is typically prefocussed by an external f/2 optical system (not shown).

In accordance with one aspect of the invention each of the central detectors 20 is comprised of a p-on-n photovoltaic device while the surrounding peripheral detector 22 is comprised of an n-on-p photovoltaic device.

Figure 3:
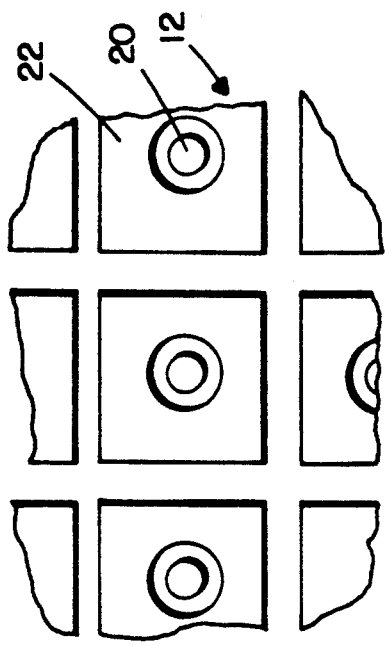
FIG. 3 is top view of one of the center-surround detectors of FIGS. 1 and 2.
Figure 4:
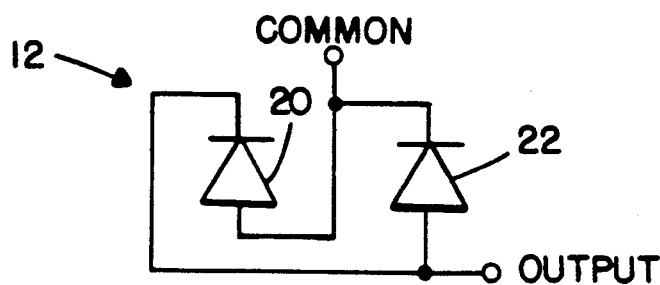
FIG. 4 is a schematic diagram showing the coupling together of two detectors to form another embodiment of a center-surround detector.

It should be realized however that the center-surround detectors 12 may also be comprised of an n-on-p central detector 20 surrounded by a p-on-n peripheral detector 22, the detector pair being coupled together in a manner shown in the schematic diagram of FIG. 4 wherein a common potential is coupled to the devices and an output terminal is coupled thereto as shown. This interconnection scheme shown in FIG. 4 is also applicable to the p-on-n central detector device of FIGS. 1–3.

In accordance with one aspect of the invention the shape and structure of the lens 18, the diffraction grating 16 features, the substrate 14 thickness and the detector 12 width and shape are adjusted to provide a "null" or minimal detector output signal when the illumination of the array 10 is substantially uniform. As indicated by the arrows A of FIG. 1, the diffraction grating 16 serves to provide diffracted radiation to uniformly flood illuminate both the central detectors 20 and the surrounding peripheral detectors 22. In addition, and as indicated by the arrows B, each central detector 20 is spot illuminated with focussed illumination from the associated lens element 18. As such, the primary focus of the incident radiation is made specifically only to the central detector 20 which, in the embodiment shown in FIG. 1, is the p-on-n detector. Under uniform illumination conditions the overall effect of spot illuminating the central detector 20 and flood illuminating the central and peripheral detectors is to produce a minimal center-surround detector 12 output. However, a change in the background illumination or the presence of a spot source within the FOV of the associated lens element 18 results in this balanced detector 12 condition being disturbed with the generation of a detector output signal.

Figure 5A:
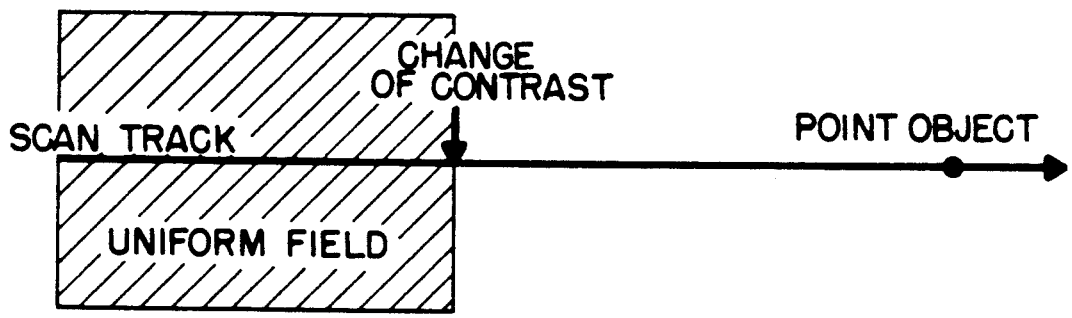
FIG. 5a illustrates a visual track over which a center-surround detector is scanned and FIG. 5b illustrates the resulting detector output signal.
Figure 5B:
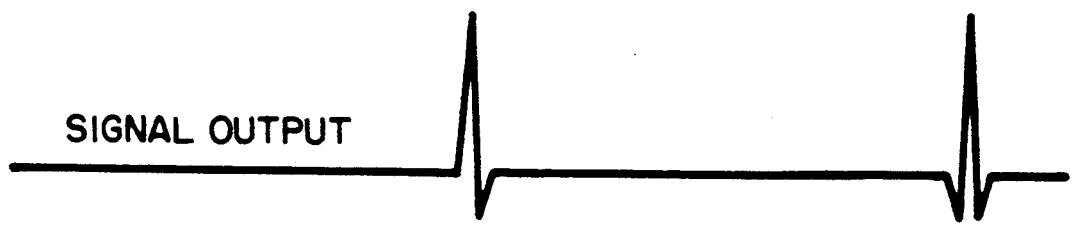

Referring now to FIG. 5a there is shown a representative scene viewed by one of the center-surround detectors 12. In the example the detector 12 is scanned along a scan track through a uniformly illuminated field. Due to the flood illumination of the detector 12 by the diffraction grating 16 no detector output is generated in the uniformly illuminated field. However, as the detector 12 is scanned to a region where a change of contrast occurs the detector 12 generates an output as seen in FIG. 5b. This output results from the momentary change in uniform detector 12 illumination due to the discontinuity at the edge of the uniformly illuminated field. After passing into the adjacent optical field the detector 12 is once more uniformly illuminated and no detector 12 output is produced. For a point object located along the scan track the detector 12 also generates an output due to the focussing by the lens element 18 of the point object radiation upon the central detector 20 with the resulting disruption of the uniformity of illumination of the detector 12.

Similar response characteristics to a change of contrast and a point object within a field of view have been observed in the study of retinal structures associated with the eyes of many species. As such, the responsivity characteristic of the center-surround detector 12 of the invention is believed to be desirable in interfacing an imaging sensor with an artificial neural network processor. The center-surround detector of the invention overcomes the aforementioned problems associated with conventional center-surround systems that require a computationally intensive post-processing of detector output signals, thereby typically precluding the use of such center-surround systems for real-time applications. The center-surround detector 12 of the invention overcomes these disadvantages of conventional systems by inherently providing the "computed" center-surround output signal directly by a combination of optical elements and specifically connected detector pairs for each image pixel. In that the invention provides that the center-surround signal of each detector of the array is derived in a parallel analog manner directly by the array of detectors a substantial reduction in cost, weight, size and complexity is achieved while simultaneously providing for an substantial increase in speed. Furthermore, interfacing with artificial neural network processors is greatly facilitated.

While the invention has been particularly shown and described with respect to a preferred embodiment thereof, it will be understood by those skilled in the art that changes in form and details may be made therein without departing from the scope and spirit of the invention.

What is claimed is:

1. A radiation detector having an output terminal for expressing a center-surround output signal, the radiation detector comprising a first radiation detector having a radiation absorbing area substantially surrounded by a radiation absorbing area of a second radiation detector, an anode of the first radiation detector being electrically coupled to a cathode of the second radiation detector, an anode of the second radiation detector being electrically coupled to a cathode of the first radiation detector and electrically coupled also to the output terminal.

2. A radiation detector as set forth in claim 1 wherein the anode of the first radiation detector is also electrically coupled to a source of voltage potential.

3. A radiation detector as set forth in claim 1 wherein the first radiation detector is a p-on-n device and wherein the second radiation detector is an n-on-p device.

4. A radiation detector as set forth in claim 2 wherein the first radiation detector is a p-on-n device and wherein the second radiation detector is an n-on-p device.

5. A radiation detector as set forth in claim 2 wherein the first radiation detector is an n-on-p device and wherein the second radiation detector is a p-on-n device.

6. An array of radiation detectors having a radiation receiving first surface and a plurality of radiation detectors disposed upon a second surface opposite the first surface, each of the radiation detectors having an output terminal for expressing a center-surround output signal, each of the radiation detectors comprising a central radiation detector having a radiation absorbing area substantially surrounded by a radiation absorbing area of a peripheral detector, an anode of the central radiation detector being electrically coupled to a cathode of the peripheral radiation detector, an anode of the peripheral radiation detector being electrically coupled to a cathode of the central radiation detector and electrically coupled also to the output terminal thereof.

7. An array as set forth in claim 6 and further comprising, for each of the radiation detectors, a radiation flux concentrating means disposed relative to the associated central radiation detector for concentrating incident optical radiation thereon, the array further comprising means for flood illuminating both the central and the peripheral radiation detectors of each of the radiation detectors.

8. An array as set forth in claim 7 wherein the flux concentrating means comprises a binary optic lens formed within the first surface of the array.

9. An array as set forth in claim 7 wherein the anode of the central radiation detector is further electrically coupled to a source of voltage potential.

10. An array as set forth in claim 8 wherein the central radiation detector is a p-on-n device and wherein the peripheral radiation detector is an n-on-p device.

11. An array as set forth in claim 9 wherein the central radiation detector is a p-on-n device and wherein the peripheral radiation detector is an n-on-p device.

12. An array as set forth in claim 9 wherein the central radiation detector is an n-on-p device and wherein the peripheral radiation detector is a p-on-n device.

13. An array as set forth in claim 7 wherein the array includes a substrate which is substantially transparent to the incident radiation, the substrate being comprised of Group II-VI material.

14. A backside illuminated array of radiation detectors each of which has an output terminal for expressing a center-surround output signal, the array comprising:
 a plurality of radiation detectors disposed substantially adjacent to a first surface of the array, each of the radiation detectors comprising a central radiation detector having a radiation absorbing area that is substantially surrounded by a radiation absorbing area of an associated peripheral radiation detector;
 transmission grating means disposed over a second surface of the array opposite the first surface for diffracting incident radiation for uniformly illuminating associated central and peripheral radiation detectors; and
 a plurality of flux concentrating means interposed between the transmission grating means and the plurality of radiation detectors, individual ones of the flux concentrating means being disposed in registration with an individual one of the radiation detectors for concentrating incident optical radiation upon the central radiation detector thereof.

15. An array as set forth in claim 14 wherein the plurality of flux concentrating means are each comprised of a lens element formed within the second surface of the array.

16. An array as set forth in claim 15 wherein the array includes a substrate comprised of material that is substantially transparent to radiation having wavelengths of interest and wherein each of the lens elements is formed within a radiation receiving surface of the substrate.

17. An array as set forth in claim 16 wherein the substrate is comprised of Group II-VI material, Group III-V material, silicon, germanium or combinations thereof.

18. An array as set forth in claim 14 wherein an anode of the central radiation detector is electrically coupled to a cathode of the peripheral radiation detector, an anode of the peripheral radiation detector being electrically coupled to a cathode of the central radiation detector and electrically coupled also to the output terminal.

19. An array as set forth in claim 16 wherein each of the lens elements is a binary optic lens element.

20. An array as set forth in claim 18 wherein the anode of the central radiation detector is also electrically coupled to a source of voltage potential.

21. An array as set forth in claim 14 wherein the grating means and the flux concentrations means are formed on a structure that is coupled to the second surface of the array.

* * * * *